United States Patent [19]

Halle

[11] Patent Number: 4,804,614

[45] Date of Patent: Feb. 14, 1989

[54] PHOTORESIST PROCESS OF FABRICATING MICROELECTRONIC CIRCUITS USING WATER PROCESSABLE DIAZONIUM COMPOUND CONTAINING CONTRAST ENHANCEMENT LAYER

[75] Inventor: Linda F. Halle, Beverly Hills, Calif.

[73] Assignee: The Aerospace Corporation, El Segundo, Calif.

[21] Appl. No.: 920,911

[22] Filed: Oct. 21, 1986

Related U.S. Application Data

[62] Division of Ser. No. 656,637, Oct. 1, 1984, abandoned.

[51] Int. Cl.$^4$ ............................................. G03F 7/26
[52] U.S. Cl. .................................... 430/311; 430/5; 430/142; 430/312; 430/326; 430/329
[58] Field of Search .................. 430/311, 312, 5, 142, 430/326, 329

[56] References Cited

U.S. PATENT DOCUMENTS

| 2,114,468 | 4/1938 | Van der Grinten | 430/14 C |
| 3,484,241 | 12/1969 | Evleth et al. | 430/15 C |
| 3,965,278 | 6/1976 | Duinker et al. | 430/28 |
| 4,217,407 | 8/1980 | Watanabe et al. | 430/326 |
| 4,663,275 | 5/1987 | West et al. | 430/326 |

FOREIGN PATENT DOCUMENTS

| 110165 | 6/1984 | European Pat. Off. | 430/156 |
| 156740 | 9/1982 | German Democratic Rep. | 430/15 C |

OTHER PUBLICATIONS

Singer, P. H., Semiconductor International, 8/1985, p. 68.
Unknown, Solid State Technology, 11/1984, p. 167.
Howe, D. G. et al., *Photographic Science and Engineering*, vol. 23, No. 6, 11/12–1979, pp. 370–374.
Griffing, B. F. et al., "Contrast Enhancement Photoresists-Processing and Modeling", C R and D, Report #82CRD252, 9/1982, pp. 1–7.
Griffing, B. F., et al., "0.4–um . . . Contrast Enhancement Lithography", IEEE Electron Device Letters, vol. EDL–4, No. 9, 9/1983, pp. 317–320.
Griffing, B. F., et al., "Application of . . . Projection Printing", SPIE, vol., 469, 1984, pp. 94–101.
West, P. R. et al., "Contrast Enhancement . . . Lithography", Crans D, #394CRD03, date unknown, 6 pages.
Griffing, B. F., et al., "Contrast Enhancement Photolithography", IEEE Electron Device Letters, vol. EDC–4, No. 1, 1/1983, pp. 14–16.
Grant, J., "Hackh's Chemical Dictionary", 4th Ed., p. 227, 1969.
Kosar, J., "Light-Sensitive Systems", J. Wiley & Sons, 1965, pp. 194–202.

*Primary Examiner*—Bowers, Jr. Charles L.
*Attorney, Agent, or Firm*—William J. Burke

[57] ABSTRACT

In a photolithographic process for fabricating microelectronic circuits, a contrast enhancing layer soluble in either water or developer that is selectively applied to a photoresist layer residing on a substrate.

1 Claim, 1 Drawing Sheet

PHOTORESIST PROCESS OF FABRICATING MICROELECTRONIC CIRCUITS USING WATER PROCESSABLE DIAZONIUM COMPOUND CONTAINING CONTRAST ENHANCEMENT LAYER

STATEMENT OF GOVERNMENT INTEREST

The invention described herein may be manufactured and used by or for the Government of the United States for governmental purposes without the payment of royalty therefor.

This is division of co-pending application Ser. No. 656,637 filed on Oct. 1, 1984, now abandoned.

BACKGROUND OF THE INVENTION

1. Field of the Invention

The invention relates generally to the field of photolithography processes, and specifically to contrast enhancement techniques.

2. Prior Art

As the scale of integrated circuits decrease, it becomes increasingly more difficult to manufacture these devices. The most common means used to transfer patterns for devices from a master mask to a semiconductor wafer is a mask aligner with a light source which operates in the near ultra-violet and blue regions of the spectrum. The light shines through the mask, selectively exposing areas of a photosensitive polymer, or photoresist. The exposed areas have different solubility characteristics relative to the unexposed areas, and the pattern can be developed out in an appropriate solvent. Unfortunately, optical mask aligners have difficulty resolving features with dimensions that are less than one micron.

The resolution limits of the optical exposure means can be extended by using a technique called contrast enhancement lithography. The contrast enhancement technique uses a two layer photolithographic process. The bottom layer is a conventional positive AZ photoresist which has as its polymer base a phenol formaldehyde (novolak) resin. The top layer, or contrast enhancement layer, is a polymeric coating which contains a dye that bleaches at the wavelength of the optical exposure apparatus. This results in a reduction of the contrast threshold of the photolithographic system, leading to an increase in the maximum resolvable spatial frequency. Thus the resolution limits of the optical exposure system are extended. All such prior art contrast enhancement layers may only be dissolved by an organic or hydrocarbon solvent which may be harmful to the user, difficult to dispose of, and represents a separate processing step.

SUMMARY OF THE INVENTION

The present invention is a water and developer soluble contrast enhanced photolithographic technique for use in optical microlithography by use of a two layer process. The bottom layer is a conventional positive photoresist. The top layer, or contrast enhancement layer (CEL), contains a dye which bleaches at the wavelength of the optical exposure apparatus, and is water and developer solution soluble. This results in a reduction of the contrast threshold of the photolithographic system, leading to an increase in the maximum resolvable spatial frequency. The photobleachable dye used in these experiments is a diazonium compound or salt, and specifically, diphenylamine-p-diazonium sulphate which is water or developer soluble. It is put in an aqueous solution of polyvinyl alcohol, which is then spun coated on top of the photoresist. This CEL coating may be removed or dissolved after exposure either by rinsing it off in water acting as a solvent before developing the photoresist or in the developer itself. The use of water promotes a solvent that is not harmful to the user and is easy to dispose of. If the developer solution is used to dissolve the CEL then the separate rinsing step may be eliminated.

Accordingly, it is the object of the invention to have a contrast enhancement layer composed of polymer solution and a diazonium compound dye solution that are both dissolvable in water or by the developer.

It is another object of the invention to have the polymer solution composed of polyvinyl alcohol which is water and developer soluble.

Yet another object of the invention is to have the diazonium dye composed of diphenylamine-p-diazonium sulphate which is water and developer soluble.

DESCRIPTION OF THE PREFERRED EMBODIMENT

Figure 1:
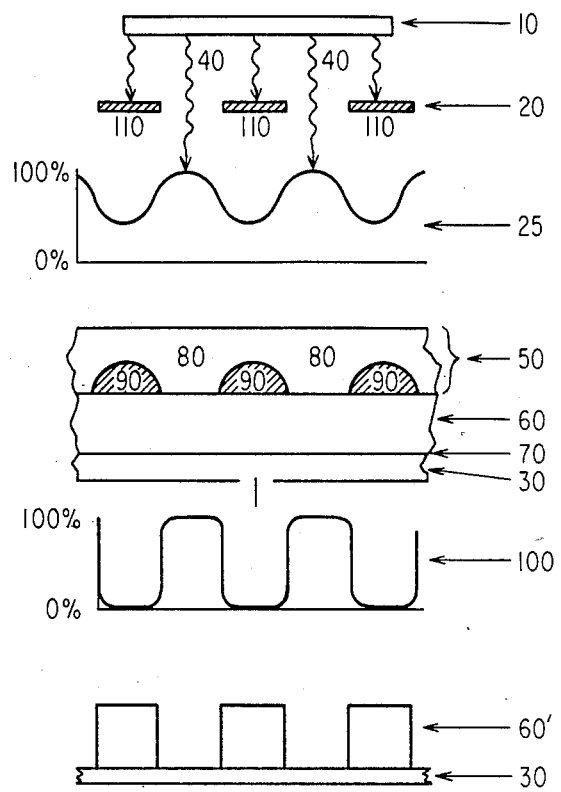
FIG. 1 is a cross section view of the contrast enhancement layer as it is fabricated.

Referring to FIG. 1, fabricating microelectric circuit devices by a photolithographic process consists of directing a light from a source 10, through a master mask 20 and onto a photosensitive polymer or photoresist covering a semiconductor substrate 30 thereby selectively exposing predetermined patterns for subsequent developing. The light source is operative to transmit in the ultra-violet (UV) and/or blue regions of the optical spectrum.

The light 40 from light source 10 transmitted through the mask 20 is degraded due to diffraction and focusing effects 110. The net result is that the contrast of the light 25 has been reduced where the contrast "C" is defined by the equation: C equals I max minus I min divided by I max plus I min where I max is maximum intensity and I min is minimum intensity for a pattern of equal lines and spaces. At high spatial frequencies, the contrast can become too low for the photoresist to distinguish between the light and dark areas of the image cast by the mask 20, that is, the contrast is below the contrast threshold of the resist. Adding what is known as a contrast enhancement layer (CEL) 50 increases the contrast of the image to which the photoresist 60 on the substrate 30 is exposed, thus enabling the extension of the resolution limits of a optical exposure system.

As is known in the prior art, the contrast enhancement technique uses a two layer photolithographic process as described by B. F. Griffing, et al, SPIE 469,94 (1984). The bottom layer 60 is the photoresist of the conventional positive AZ type. The top layer 50 is the aforementioned contrast enhancement layer which is spun directly on top of the photoresist layer 60. In the preferred embodiment, the top layer 50 is of uniform consistency and has a specified thickness ranging between less than one micron and five microns. The contrast enhancement layer 50 is a polymer coating which contains a dye that bleaches at the wavelength of the light source or optical exposure apparatus 10. In order to be effective the exposure time of the photoresist layer 60 must be shorter than the time required for the dye to bleach in the exposed or bleached areas 80 of the CEL 50. During the exposure process, the unbleached portions of the contrast enhancement layer 50 will set as a portable conformable mask. This results in an increase in the contrast of the image 100 exposing the photoresist layer 60, which will lead to sharper resist profiles 60'. The problem with the prior art CEL layer 50 is that the polymer and dye contained therein may only be dissolved in an organic or hydrocarbon solvent that may be harmful to the user, difficult to dispose of, and a separate expensive step.

Figure 2:
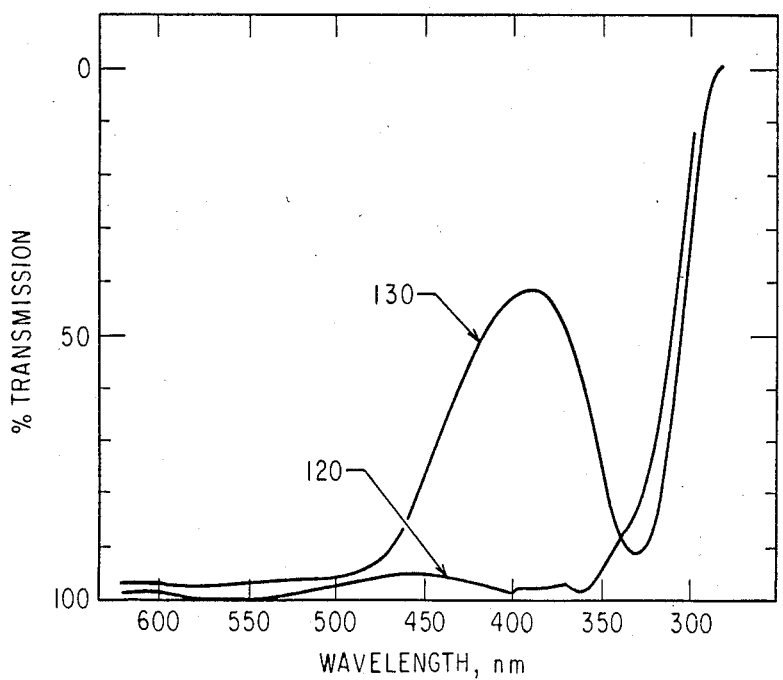
FIG. 2 is the absorption spectrum of the contrast enhancement layer of FIG. 1 in its bleached and unbleached state.

The present invention comprises an improvement on the above contrast enhancement technique and comprises the unique feature of a contrast enhancement layer 50 that is water soluble and thus nontoxic to the user and easy to dispose of. Alternatively, the succeeding developer solution for the photoresist may be used to dissolve the CEL layer 50 thereby eliminating the rinsing step altogether. The contrast enhancement layer 50 in its liquid form comprises an aqueous solution of polyvinyl alcohol to which is added a photobleachable yellow dye of diazonium salt compound or salt. The preferred diazonium compound being diphenylamine-p-diazonium sulphate. This particular dye bleaches at a energy fluence of 100–180 mJ cm-2 for the wavelengths of 365 nm, 405 nm, and 436 nm. These wavelengths being the mercury lines at which photoresists are commonly exposed. The absorption spectrum 120,130 of the bleached and unbleached areas 80 and 90 respectively of the contrast enhancement layer 50 are shown in FIG. 2. It will be appreciated that the entire absorption band in the visible region disappears upon bleaching by said wavelength.

Because the contrast enhancement layer 50 in the present invention is water soluble, it requires no exposure by the user to harmful or toxic prior art hydrocarbon solvents to dissolve the layer 50. The contrast enhancement layer 50 may be removed after exposure of the wafer 30 either by rinsing the wafer 30 with the aforementioned water before development of the photoresist layer 60 or by rinsing in the developer itself thereby eliminating a separate rinsing step.

The dye used in the present invention for the CEL layer 50 is fabricated by taking commercially available diphenylamine-p-diazonium sulfate in powder form and recrystallizing it from a 3:1 solution of 2-propanol and water, after which fine yellow needle-shaped crystals are formed. A dye concentration of 0.034M (M=Molars) was used, but very wide latitudes in dye concentrations are possible including the range of 0.02 to 0.07M without significantly effecting the water or developer solubility of the contrast enhancement layer 50.

The polyvinyl alcohol used as the polymer in the aqueous solution for the CEL layer 50 has an optimal concentration of 9% by weight but may vary widely including the range of 2 to 20%.

In solution, the dye in CEL 50 photoreacts to form a phenol, nitrogen, and sulphuric acid. In other words, the contrast enhancement layer 50 originally is unbleached, but after exposure or nonexposure of the dye, by the light source 10 through mask 20, it becomes selectively bleached and unbleached in areas 80 and 90, respectively.

It will be appreciated that the image from the light source 10 is degraded from transmission through the mask 20 so that there is significant intensity in corresponding opaque portions 110 of the mask 20. A partially bleached contrast enhancement layer 50 can increase the contrast of the image because the unbleached, light-absorbing portions or areas 90 of the layer 50 correspond to the opaque areas 110 of the mask 20. Accordingly, the enhanced or contrasted image 100 to which the photoresist 60, is exposed, results in sharper resist profiles 60'.

The process for using the contrast enhancement layer 50 comprises of spinning a photoresist layer 60 of the surface 70 of the wafer 30 to be patterned. The photoresist layer 60 is soft-baked about 30 minutes. The polyvinyl alcohol/dye solution is then spun on as the contrast enhancement layer 50 directly on top of the baked photoresist layer 60 and can be baked for another three to five minutes. The wafer 30 is then exposed by the light source 10 through the mask 20. The exposure time will relatively increase above the normal required time. The actual amount of increase will be dependent on the light intensity of the light source 10. The contrast enhancement layer 50 of the preferred embodiment will bleach the predetermined area 80 as noted supra at an energy fluence of 100–180 mJ cm-2. The contrast enhancement layer 50 may then be removed by a relatively short rinse or wash in water for about ten to sixty seconds, at which point the photoresist layer 60 may be developed according to the normal procedures. Alternatively, the developer solution may be used for rinsing thereby eliminating a separate step.

It will be appreciated that a major feature of the present invention is that the contrast enhancement layer 50 may be washed or dissolved off the photoresist layer 60 through the means of ordinary water as the solvent or the developer solution itself rather than the use of prior art toxic chemicals such as organic or hydrocarbon solvents. It will be further appreciated that the polymer and dye used by the present invention is not dissoluble by prior art organic or hydrocarbon solvents.

While a particular embodiment of the present invention has been described and illustrated, it will be apparent to those skilled in the art that changes and modifications may be made thereon without departure from the spirit and scope of the invention as claimed.

What is claimed is:

1. A photolithographic process for fabricating microelectronic circuits on a substrate comprising:
   a. applying on the substrate a layer of positive photoresist, said photoresist being developable in an aqueous solution after exposure to predetermined wavelengths;
   b. applying directly on the photoresist a contrast enhancement layer consisting of a water soluble binder and a water soluble diazonium compound bleachable at the predetermined wavelengths;
   c. exposing the contrast enhancement layer to an image formed by light at the predetermined wavelengths, thereby bleaching the contrast enhancement layer and exposing the photoresist and rendering the photoresist developable;
   d. immersing the coated substrate in an aqueous solution of photoresist developer, thereby dissolving the contrast enhancement layer with photoresist developer and developing the photoresist, resulting in the complete removal of the contrast enhancement layer and the development of the photoresist.

* * * * *